United States Patent
Prats Mustarós

(10) Patent No.: US 9,494,624 B2
(45) Date of Patent: Nov. 15, 2016

(54) METHOD OF MONITORING A WIND TURBINE

(71) Applicant: ALSTOM RENOVABLES ESPAÑA, S.L., Barcelona (ES)

(72) Inventor: Josep Prats Mustarós, Barcelona (ES)

(73) Assignee: ALSTOM RENOVABLES ESPANA, S.L., Barcelona (ES)

( * ) Notice: Subject to any disclaimer, the term of this patent is extended or adjusted under 35 U.S.C. 154(b) by 504 days.

(21) Appl. No.: 14/020,754

(22) Filed: Sep. 6, 2013

(65) Prior Publication Data

US 2014/0100800 A1    Apr. 10, 2014

Related U.S. Application Data

(60) Provisional application No. 61/735,499, filed on Dec. 10, 2012.

(30) Foreign Application Priority Data

Oct. 9, 2012 (EP) .................................. 12382388

(51) Int. Cl.
  *F03D 7/00* (2006.01)
  *G01R 19/25* (2006.01)
  *F03D 7/02* (2006.01)

(52) U.S. Cl.
  CPC ......... *G01R 19/2513* (2013.01); *F03D 7/0224* (2013.01); *F03D 7/0276* (2013.01); *F03D 17/00* (2016.05); *F05B 2270/20* (2013.01); *F05B 2270/303* (2013.01); *F05B 2270/32* (2013.01); *F05B 2270/324* (2013.01); CPC ... *F05B 2270/335* (2013.01); *Y02E 10/722* (2013.01); *Y02E 10/723* (2013.01)

(58) Field of Classification Search
  CPC ..... G01R 19/2513; F03D 7/00; F03D 7/022; F03D 7/0224; F03D 7/0228; F03D 7/0276; F03D 11/0091
  See application file for complete search history.

(56) References Cited

U.S. PATENT DOCUMENTS

2009/0295159 A1   12/2009   Johnson et al.
2013/0166082 A1*   6/2013   Ambekar ............... G05B 13/04
                                                        700/287

FOREIGN PATENT DOCUMENTS

WO    WO 2011/150931    12/2011

OTHER PUBLICATIONS

European Search Report for EP 12382388, mailed Mar. 25, 2013, 8 pgs.
Kjellin et al., "Power coefficient measurement on a 12 KW straight bladed vertical axis wind turbine", Renewable Energy 36 pp. 3050-3053 (2011).

* cited by examiner

Primary Examiner — Toan Le
(74) Attorney, Agent, or Firm — Squire Patton Boggs (US) LLP

(57) ABSTRACT

A method of real-time monitoring of the operation of a wind turbine in an operational region of theoretically constant power coefficient is disclosed. The method comprises measuring the electrical power generated by the wind turbine, a representative wind speed, and an ambient temperature. The wind power available to the wind turbine for a given moment in time may be calculated based on the measured ambient temperature and measured representative wind speed. The aerodynamic power captured by the wind turbine at the same moment in time may be determined based on the measured electrical power generated. And the practical power coefficient may be calculated by dividing the aerodynamic power captured by the calculated available wind power.

17 Claims, 3 Drawing Sheets

METHOD OF MONITORING A WIND TURBINE

This application claims the benefit of European Patent Application EP12382388.2 filed on Oct. 9, 2012 and U.S. Provisional Patent Application Ser. No. 61/735,499 filed on Dec. 10, 2012, the disclosures of which are hereby incorporated by reference in their entirety for all purposes.

The present disclosure relates to a method of monitoring a wind turbine. It further relates to a method of operating a wind turbine.

BACKGROUND ART

Modern wind turbines are commonly used to supply electricity into the electrical grid. Wind turbines of this kind generally comprise a rotor and a plurality of blades. The rotor is set into rotation under the influence of the wind on the blades. The rotation of the rotor shaft either directly drives the generator rotor ("directly driven") or through the use of a gearbox.

A variable wind speed turbine may typically be controlled by varying the generator torque and the pitch angle of the blades. As a result, aerodynamic torque, rotor speed and electrical power will vary.

A common control strategy of a variable speed wind turbine is described with reference to FIG. 1. In FIG. 1, the operation of the wind turbine is illustrated in terms of the pitch angle ($\beta$), the electrical power generated (P), the generator torque (M) and the rotational velocity of the rotor ($\omega$), as a function of the wind speed.

In a first operational range, just above the cut-in wind speed, the rotor is controlled to rotate at a substantially constant speed that is just high enough to be able to accurately control it. The cut-in wind speed may be e.g. 3 m/s.

In a second operational range, the objective is generally to maximize power output by maintaining the pitch angle of the blades constant so as to capture maximum energy. The generator torque and rotor speed are varied so as to keep the tip speed ratio (tangential velocity of the tip of the rotor blades divided by the prevailing wind speed) constant so as to maximize the power coefficient $C_p$.

In general, the power coefficient of a wind turbine may be calculated in accordance with the following equation:

$$C_P = \frac{P_{captured}}{P_{available}},$$

wherein $P_{captured}$ is the aerodynamic power captured by the rotor, and $P_{available}$ is the power available in the wind passing through the rotor swept area. The power coefficient $C_p$ is thus a measure of how efficient the wind turbine is operating.

The available power in the wind may be calculated in accordance with the following equation:

$$P_{available} = \frac{\rho \cdot V^3 \cdot A}{2},$$

wherein $\rho$ is the air density, A is the rotor swept area and V is the wind speed, which in this equation is assumed to be constant over the entire rotor diameter.

In order to maximize power output and keep $C_p$ constant at its maximum value, the rotor torque may be set approximately in accordance with the following equation:

$T = \kappa \cdot \omega^2$, wherein k is a constant, and $\omega$ is the rotational speed of the generator. In a direct drive wind turbine, the generator speed substantially equals the rotor speed. In a wind turbine comprising a gearbox, normally, a substantially constant ratio exists between the rotor speed and the generator speed.

In a third operational range, which starts at reaching nominal rotor rotational speed and extends until reaching nominal power, The rotor speed is kept constant, and the generator torque is varied to such effect. This may correspond to a wind speed range of e.g. approximately 8.5 m/s to approximately 11 m/s.

In a fourth operational range, above the nominal wind speed to the cut-out wind speed (for example from approximately 11 m/s to 25 m/s), the blades are rotated ("pitched") to maintain the aerodynamic torque delivered by the rotor substantially constant. At the cut-out wind speed, the wind turbine's operation is interrupted.

In the first, second and third operational ranges, i.e. at wind speeds below the nominal wind speed, the blades are kept in a constant pitch position, namely the "below rated pitch position" at wind speeds equal to or below nominal wind speed. Said default pitch position may generally be close to a 0° pitch angle. The exact pitch angle in "below rated" conditions depends however on the complete design of the wind turbine.

Depending on the precise location of a wind turbine, and the corresponding local wind regime, the occurrences of high speed winds and low speeds winds may vary. Generally speaking however, the wind turbine spends most of its operating life in the second operation range, i.e. the range of theoretical optimum power coefficient. It is thus important, that especially during this second operational range the wind turbine yields as much energy as possible.

The performance of wind turbines is generally assessed off-line, i.e. not during the actual operation of the wind turbine but by the application of off-line statistical methods to extract information from a large number of parameters that have been measured and/or registered during operation. Alternatively, power curve measurements to characterize the performance of wind turbines over the complete operating range may be performed under standardized circumstances. In the latter case, large periods of time are usually required for this kind of testing as said standardized circumstances might be difficult to obtain due to the inherent stochastic behaviour of the wind.

Power curve measurements may also be performed based on measurements of an anemometer arranged on the nacelle. It is further known to compare power curves of one wind turbine with another turbine operating in substantially the same wind regime. The measurements of the anemometer on the nacelle are easily available however relatively inaccurate; the flow of the air is generally so disturbed by the rotor that the wind speed may not be representative for the wind speed in the rotor swept area. Furthermore, especially in the case of wind turbines with rotors having larger diameters, the wind speed may vary significantly over the rotor diameter. In order to improve the accuracy of nacelle anemometry, calibration procedures may be performed.

Generally speaking, off-line methods used for wind turbine characterization can indeed provide relevant information about its long-term operational state. Nevertheless, they are usually quite time-consuming, so they lack the ability to provide fast responses to the system. Furthermore, statistical analysis can fail to detect specific operating regimes, especially those with low probability of occurrence, which can be smoothed and remain undetected after statistical treatment of data.

There may be various causes that can cause a deterioration of the performance of a wind turbine during its operation, such as e.g. dirt accretion on the blades, wind shear, yaw misalignment, drive train deterioration, control errors etc. It is thus important that the performance of a wind turbine can be monitored in real-time during operation of the turbine.

In various examples of the present invention, such monitoring is provided. Furthermore, with the proper monitoring, the operation of the wind turbine may be adjusted to improve the energy yield if inefficient operation is detected.

SUMMARY

According to a first aspect, a method of real-time monitoring of the operation of a wind turbine is provided, focused on the operational region of theoretically constant power coefficient. The wind turbine may have a rotor with a plurality of rotor blades and a generator and the method comprises measuring the electrical power generated by the wind turbine, a representative wind speed, and an ambient temperature. The wind power available at a moment in time to the wind turbine may then be calculated based on the measured ambient temperature and measured representative wind speed, and the aerodynamic power captured by the wind turbine at the same moment in time may be calculated based on the measured electrical power generated. Finally, the practical power coefficient may be calculated in real-time by dividing the aerodynamic power captured by the calculated available wind power.

This way, a method of monitoring the operation of a wind turbine in real-time is provided which is more reliable. The ambient temperature may be measured in a reliable manner, so that the density of the air may be determined locally (and may therefore be more reliable than when assumed constant and known for a specific location). Also, the electrical power generated by the generator may be determined in a reliable manner at any given moment. In fact, in any wind turbine connected to the electrical grid, this parameter is normally always measured. Based on the electrical power generated, the aerodynamic power actually captured by the rotor may be determined taking losses along the drive train (transmission, gearbox, generator and converter) and power consumed in auxiliary systems into account.

Finally, a representative wind speed may be measured in order to determine the energy available to the wind turbine. A representative wind speed may be measured by an anemometer on the nacelle, which may be corrected based on a calibration procedure of the nacelle anemometer prior to operation. The wind speed could also be measured on a nearby measuring pole. Alternatively, the wind speed may be measured by a LIDAR.

The measurements of electrical power generated, temperature, and wind speed may be carried out substantially simultaneously, although the measurements of the different variables may not be necessarily made with the same frequency. Typically, the temperature will not vary very quickly so that it does not need to be measured as frequently. The wind speed measurements may be instantaneous or may be average values determined over a period of time, e.g. a minute.

The representative wind speed may also be corrected for wind shear.

In any case, the wind speed may be more difficult to measure than other variables. Even if there is an inaccuracy in the wind speed, the effect on the monitoring is not necessary very significant, because of the range in which the power coefficient ($C_p$) is monitored. The power coefficient is constant in that range, so that variations of the measured wind speed determine the calculated $C_p$ value but they do not lead to significant variations of that calculated value along the operational range. In other operational ranges, $C_p$ would vary heavily as a function of the measured wind speed, so that an inaccuracy would have a double effect on the determination of the power coefficient.

In some embodiments, the aerodynamic power captured by the wind turbine may be calculated using a generator losses model representative for losses in the generator, a power converter losses model for losses in the power converter and a drive train losses model representative for losses in the drive train. The losses models may be in the form of e.g. mathematical functions or look-up tables. In this respect, the drive train should be understood to comprise the rotor, rotor shaft, gearbox, and high speed shaft (as far as these components are present in the wind turbine).

In some embodiments, the available wind power may be calculated based on a measured local atmospheric pressure. Alternatively, the available wind power may be calculated based on the elevation of the site of the wind turbine.

Air density may be calculated in accordance with the following equation:

$$\rho = \frac{p}{R_{specific}T},$$

wherein $\rho$ is the air density, p is the atmospheric pressure, T is the (absolute) temperature and $R_{specific}$ is the gas constant of the air.

The atmospheric pressure may be measured locally, or calculated in accordance with the following equation:

$$p_h = p_0 \cdot e^{\frac{-mgh}{RT_0}},$$

wherein $p_h$ is the atmospheric pressure, $p_0$ is the standard atmospheric pressure at sea level (101.325 kPa), h is the local altitude, g is the earth's gravitational acceleration (9.81 m/s$^2$), and $T_0$ is the absolute temperature at sea level.

In some embodiments, the calculated practical power coefficient may be provided to a wind turbine control system. The wind turbine control system may take the practical power coefficient into account and make operational changes if necessary.

For example, if the calculated power coefficient is substantially constant over the whole range, but is substantially lower than the theoretical power coefficient, a first operational change may be made. Alternatively, if the calculated power coefficient is not constant over the whole range, a second operational change may be made. Operational changes may comprise a change in (default) pitch angle, a change in rotational velocity of the wind turbine, but may also comprise a change in maintenance interval.

Additional objects, advantages and features of embodiments of the invention will become apparent to those skilled in the art upon examination of the description, or may be learned by practice of the invention.

BRIEF DESCRIPTION OF THE DRAWINGS

Particular embodiments of the present invention will be described in the following by way of non-limiting examples, with reference to the appended drawings, in which.

DETAILED DESCRIPTION OF EMBODIMENTS

Figure 1:
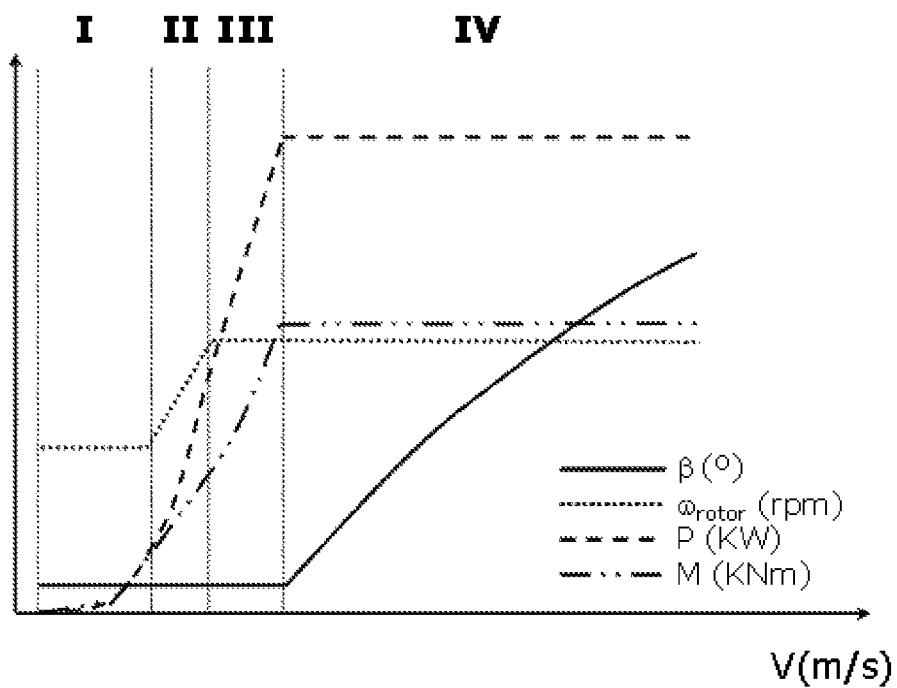
FIG. 1 illustrates a typical power curve of a wind turbine.

FIG. 1 illustrates a prior art control method and shows respectively the pitch angle (β), rotor speed ($\omega_{rotor}$), electrical power (P) and aerodynamic torque (M) at varying wind speeds.

A variable speed horizontal axis wind turbine may comprising a sub-nominal zone of operation for wind speeds below the nominal wind speed and a supra-nominal zone of operation for wind speeds above the nominal wind speed, wherein the sub-nominal zone of operation comprises a first, a second and a third operational range. The first operational range extends from a cut-in wind speed to a first wind speed, wherein the rotor speed is kept substantially constant at a first value. The second operational range extends from the first wind speed to a second wind speed, wherein both the rotor speed and generator torque are varied as a function of wind speed. The third operational range extends from the second wind speed to the nominal wind speed, wherein the rotor speed is kept substantially constant at a second value.

As previously described, the pitch angle is generally not changed until nominal wind speed is reached, e.g. at 11 m/s, at the end of the third operational range. At a slightly lower wind speed, at the end of the second operational range e.g. around 8.5 m/s, nominal rotor speed may be reached. At wind speeds above nominal wind speed, the pitch angle may be varied such as to maintain the aerodynamic torque substantially constant. The rotor speed, generator torque and electrical power generated may also be maintained substantially constant. This may be maintained from nominal wind speed to cut-out wind speed.

In the second operational range, both the rotor speed and generator torque may be varied to achieve maximum power coefficient $C_p$. Over the second operational range, the power coefficient may be kept substantially constant at its maximum value.

Figure 2A:
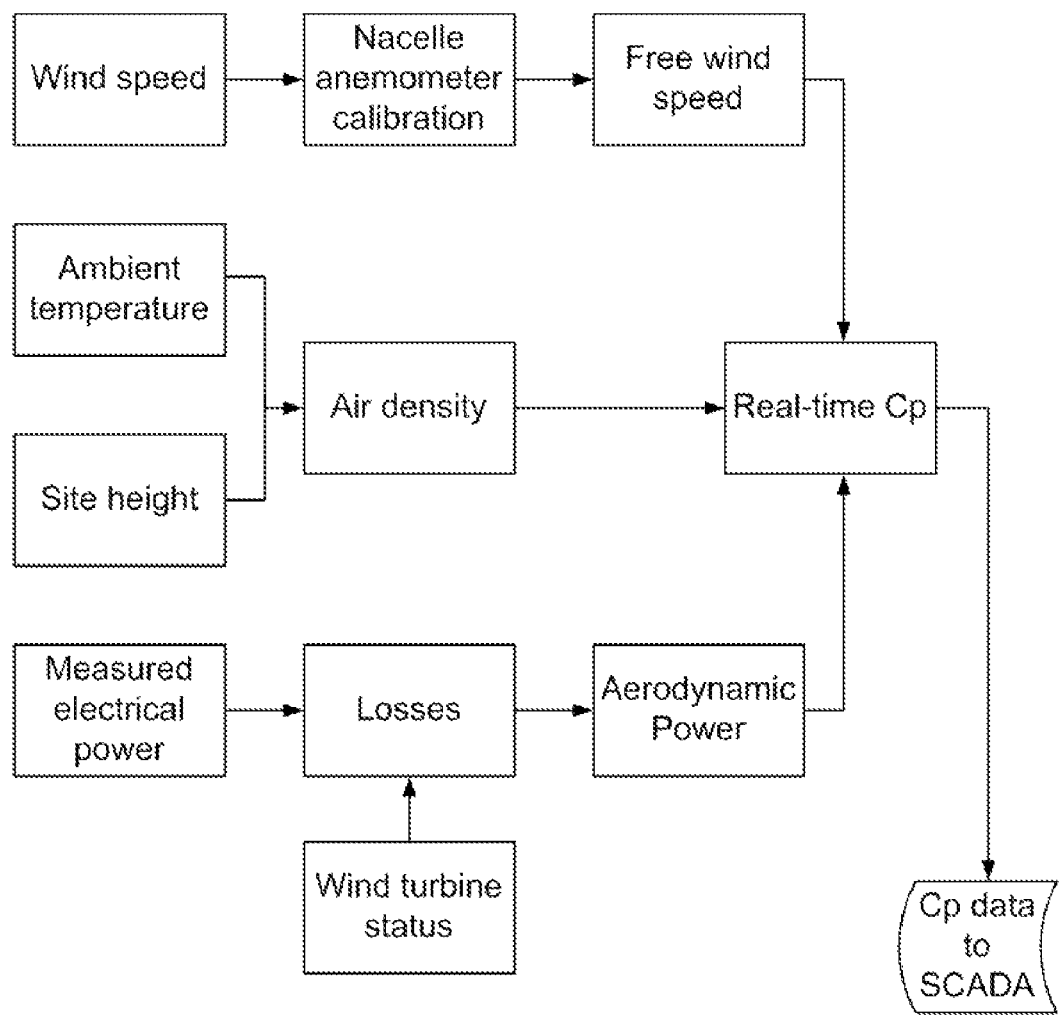
FIG. 2*a* schematically illustrates an example of a method of real-time monitoring of the operation of a wind turbine.

FIG. 2*a* schematically illustrates an example of a method of monitoring the operation of a wind turbine. A wind speed may be measured by an anemometer on top of the nacelle of the wind turbine. Also the ambient temperature may be measured as well as the electrical power generated by the wind turbine. It will be clear that the ambient temperature will not vary to the same extent as e.g. the wind speed and the electrical power generated, so that it will not be necessary to measure these parameters with the same frequency.

The measured wind speed may be an instantaneous wind speed measured at a specific moment, but may also be an average wind speed measured over a short period of time e.g. 0.5 seconds, 1 second, a few seconds or even minutes.

Figure 2B:
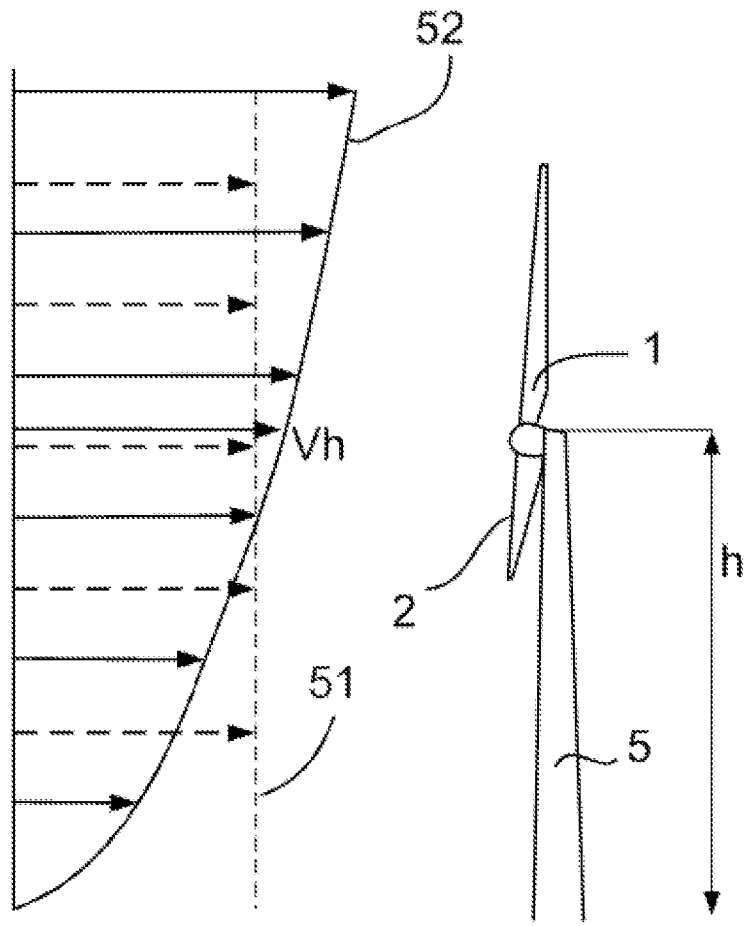
FIG. 2*b* illustrates the phenomenon of wind shear.

Based on the measured wind speed, a wind speed representative for the whole of the rotor area may be determined, as illustrated in FIG. 2*b*. In this figure, a wind turbine comprising a tower 5 and a plurality of blades 1 and 2 is shown. The wind profile at any given moment may be represented schematically by profile 52. The tendency of the wind speed to increase with height is generally referred to as wind shear.

The wind velocity measured at height h (approximately the height of the nacelle) may correspond to Vh. The wind velocity profile used for calculating the energy of the rotor swept area may be like indicated with reference sign 52. A wind speed 51 representative for the whole of the rotor area may be determined to account for the effect of wind shear.

Known methods of nacelle anemometer calibration may be used in order to increase the reliability of wind speed measurements, avoiding or reducing the influence of the nacelle body and the rotor on the wind speed measurements.

By measuring the ambient temperature and determining the atmospheric pressure, the air density may be calculated in accordance with the following equation:

$$\rho = \frac{p}{R_{specific}T},$$

wherein ρ is the air density, p is the atmospheric pressure, T is the (absolute) temperature and $R_{specific}$ is the specific gas constant for air. For dry air, the specific gas constant may be assumed to be 287.04 J/kgK. The atmospheric pressure may be measured locally, or may be estimated based on the geographical altitude (elevation) of the wind turbine.

If both the air density and a representative wind speed are known, the energy available in the area of the rotor at a given moment in time may be determined:

$$P_{available} = \frac{\rho \cdot V^3 \cdot A}{2}$$

On the other hand, the measurement of electrical power may be used to determine the aerodynamic power captured to the rotor. Electrical power as generated by the wind turbine may generally be measured as the power injected into the electrical grid. All losses between the rotor blades and the injection into the grid and also the consumption of electrical power in the wind turbine itself have to be taken into account to determine the aerodynamic power captured by the blades. Losses in the drive train (transmission, gearbox, generator, and generator converter) may be derived e.g. from empirical data of the drive train before the wind turbine is operating. The losses may also be determined from a datasheet provided by a manufacturer of the components, such as the generator.

The electrical power generated by the wind turbine could also be measured, at least theoretically, as the output of the generator, instead of the input into the electrical grid. In this case, the consumption of auxiliary systems does not need to be taken into account.

Figure 3:
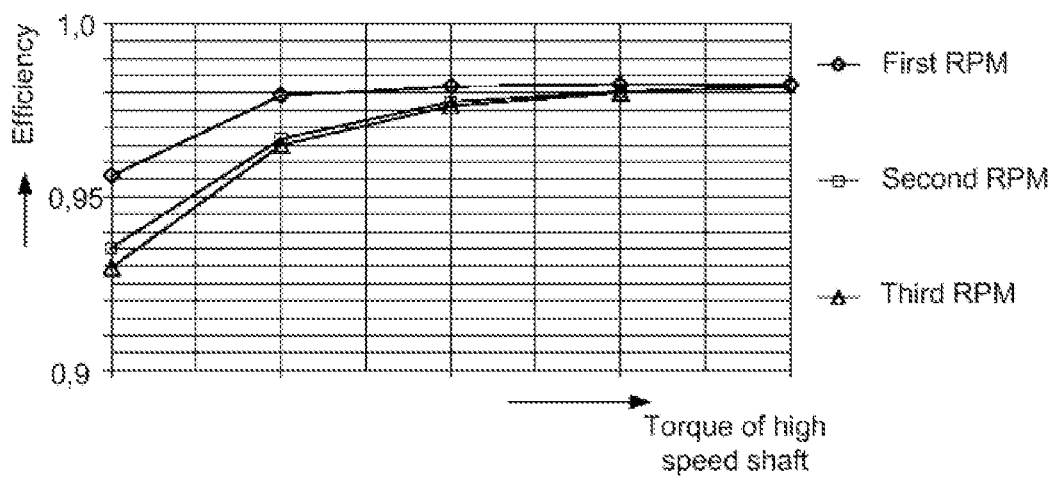
FIG. 3 schematically illustrates examples of efficiency curves of a gearbox which may be used in order to determine losses in a drive train.

FIG. 3 illustrates efficiency curves of a generator as may be empirically determined for different rotational velocities. Similar data may be available for components such as the gearbox and generator converter.

When the losses along the drive train and possibly the wind turbine's own power consumption (in auxiliary systems, such as yaw, pitch, light systems, air conditioning etc.) are added to the measured generated electrical power, the aerodynamic power as captured by the rotor can be determined. These power losses and the wind turbine's own power consumption can be determined or calculated as a function of the wind turbine's operational status (generated power, rotational speed, current system status, etc.) to determine the aerodynamic power as captured by the rotor.

The power coefficient at a given moment in time, as a measure of indicating the performance of the wind turbine may then be calculated by:

$$C_P = \frac{P_{captured}}{P_{avaiable}}$$

In some implementations of the present invention, the power coefficient determined in real-time may be sent to a SCADA and used in the control of the wind turbine. For example, if the power coefficient decreases with increasing rotor speed, this may be indicative of a drive train problem.

On the other hand, if the power coefficient is low but constant over the relevant operational range, this may indicate that the density of the air is lower than assumed during design. An adjustment of the pitch or rotational velocity may be carried out to adapt for this. This may be done e.g. in a trial and error process so that, after a first modification of an adjustable parameter, the evolution of $C_p$ is analysed. This process may be iteratively repeated with the goal to achieve the maximum available $C_p$ value for actual conditions.

However, a constant low power coefficient may be indicative of e.g. dirt or ice accretion on the blades, especially if simultaneously higher blade loads are observed. Dirt and ice accretion are known to induce, at least for a certain period of time, significant modifications on the aerodynamic behaviour of the blades. In this case, a pitch angle different to that defined by the above-mentioned "below rated pitch position" can result in better aerodynamic properties. Therefore, if this situation occurs, the "below rated pitch position" may be redefined and adapted to the new blade position resulting in the maximum $C_p$ value. As a trial and error process may be implemented to track the performance of the wind turbine, said "below rated pitch position" may be adapted in real-time to varying conditions, i.e. dirt or ice removal by rain or high temperatures respectively.

With examples of the present invention, a further indicator (power coefficient) may be used in real-time control of a wind turbine.

Although only a number of particular embodiments and examples of the invention have been disclosed herein, it will be understood by those skilled in the art that other alternative embodiments and/or uses of the invention and obvious modifications and equivalents thereof are possible. Furthermore, the present invention covers all possible combinations of the particular embodiments described. Thus, the scope of the present invention should not be limited by particular embodiments, but should be determined only by a fair reading of the claims that follow.

The invention claimed is:

1. A method of real-time operational control of a wind turbine within an operational region of theoretically constant power coefficient, the wind turbine having a rotor with a plurality of rotor blades and a generator, the method comprising:
measuring electrical power generated by the wind turbine, a representative wind speed, and an ambient temperature;
calculating wind power available to the wind turbine at a moment in time based on the measured ambient temperature and the measured representative wind speed;
determining aerodynamic power captured by the wind turbine at substantially the same moment in time based on the measured electrical power generated; and
calculating a practical power coefficient by dividing the aerodynamic power captured by the calculated available wind power, and
collecting the practical power coefficient over an operational region of theoretically constant power coefficient, and
providing the collected practical power coefficient to a wind turbine control system, and
using the wind turbine control system, making an operational change based on the collected practical power coefficient.

2. The method of claim 1, wherein the representative wind speed is measured by an anemometer based on a nacelle of the wind turbine.

3. The method of claim 1, wherein the aerodynamic power captured by the wind turbine is calculated using a generator losses model representative for losses in the generator and/or a drive train losses model representative for losses in the drive train and/or a power converter losses model representative for losses in the power converter.

4. The method of claim 3, wherein the generator losses model is a look-up table of generator losses.

5. The method of claim 1, wherein the aerodynamic power captured by the wind turbine is calculated using a drive train losses model representative for losses in the generator.

6. The method of claim 5, wherein the drive train losses model is a look-up table of drive train losses.

7. The method of claim 1, wherein the available wind power is calculated based on a measured local atmospheric pressure.

8. The method of claim 1, wherein the available wind power is calculated based on an elevation of the site of the wind turbine.

9. The method of claim 1, wherein if the calculated power coefficient is substantially constant over the whole range, but is substantially lower than the theoretical power coefficient, a first operational change is made.

10. The method of claim 9, wherein if the calculated power coefficient is not constant over the whole range, a second operational change is made.

11. The method of claim 1, wherein the adjusting at least one operational parameter comprises adjusting the pitch angle of one or more blades within the operational region of theoretically constant power coefficient.

12. The method of claim 1, wherein adjusting at least one operational parameter comprises adjusting the rotational velocity of the rotor of the wind turbine.

13. The method of claim 1, wherein adjusting at least one operational parameter comprises changing a maintenance interval of the wind turbine.

14. A wind turbine comprising:
a rotor with a plurality of blades,
a generator, and
a sensor for measuring electrical power generated by the generator, and a control system, wherein
the control system is adapted to receive measurements from the sensor for measuring the electrical power, measurements of a representative wind speed and measurements of an ambient temperature, and the control system is configured to calculate wind power available to the wind turbine at a moment in time based on the measured ambient temperature and the measured representative wind speed;

determine the aerodynamic power captured by the wind turbine at substantially the same moment in time based on the measured electrical power generated;

calculate a practical power coefficient by dividing the aerodynamic power captured by the calculated available wind power;

collect the practical power coefficient over a range of theoretically constant power coefficient; and to make an operational change based on the collected practical power coefficient.

15. The wind turbine of claim 14, further comprising a sensor for measuring the ambient temperature and adapted to provide the measurements to the control system.

16. The wind turbine of claim 14, further comprising a sensor for measuring a representative wind speed and adapted to provide the measurements to the control system.

17. A wind park comprising the wind turbine of claim 14, wherein the measurements of a representative wind speed and the measurements of the ambient temperature are provided by a system of the wind park external to the wind turbine.

* * * * *